United States Patent
Makinouchi et al.

(10) Patent No.: US 6,259,511 B1
(45) Date of Patent: Jul. 10, 2001

(54) SCANNING TYPE EXPOSURE APPARATUS

(75) Inventors: Susumu Makinouchi, Zama; Toshio Ueda, Saitama-ken, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/450,566

(22) Filed: Nov. 30, 1999

Related U.S. Application Data

(60) Continuation of application No. 08/899,135, filed on Jul. 23, 1997, now abandoned, which is a division of application No. 08/464,369, filed on Jun. 5, 1995, now Pat. No. 5,699,145, which is a continuation-in-part of application No. 08/274,037, filed on Jul. 12, 1994, now abandoned.

(30) Foreign Application Priority Data

| Jul. 14, 1993 | (JP) | 5-174161 |
| Jun. 17, 1994 | (JP) | 6-135615 |

(51) Int. Cl.$^7$ .................................................. G03B 27/42
(52) U.S. Cl. .................................................. 355/53; 355/77
(58) Field of Search ................................ 355/43, 53, 77; 430/5; 356/399–401; 250/548, 559.3, 206.1, 206, 206.3

(56) References Cited

U.S. PATENT DOCUMENTS

| 4,641,071 | * | 2/1987 | Tazawa et al. | 318/640 |
| 4,711,567 | * | 12/1987 | Tanimoto | 355/53 |
| 4,747,678 | | 5/1988 | Shafer et al. | 350/505 |
| 4,780,616 | | 10/1988 | Nishi et al. | 250/548 |
| 4,924,257 | | 5/1990 | Jain | 355/53 |
| 5,124,927 | * | 6/1992 | Hopewell et al. | 356/401 |
| 5,194,893 | | 3/1993 | Nishi | 355/53 |
| 5,281,996 | | 1/1994 | Bruning et al. | 355/77 |
| 5,289,263 | * | 2/1994 | Kiyokawa et al. | 355/53 |
| 5,291,240 | * | 3/1994 | Pain | 355/53 |
| 5,361,122 | * | 11/1994 | Katoaka et al. | 355/53 |
| 5,477,304 | * | 12/1995 | Nishi | 355/53 |
| 5,506,684 | * | 4/1996 | Ota et al. | 356/401 |
| 5,524,131 | * | 6/1996 | Uzawa et al. | 378/34 |
| 5,850,280 | * | 12/1998 | Ohtomo et al. | 355/53 |

FOREIGN PATENT DOCUMENTS 0360272   3/1990   (EP) .

* cited by examiner

*Primary Examiner*—D. Rutledge
(74) *Attorney, Agent, or Firm*—Miles & Stockbridge P.C.

(57) ABSTRACT

A scanning type exposure apparatus includes a mask stage which can move a mask along a predetermined scanning direction; a substrate stage which can move a substrate, onto which a pattern on the mask is to be transferred, along the scanning direction; a fine movement stage which is arranged on one of the mask stage and the substrate stage, and is movable along the scanning direction relative to the one stage; a first measuring device for detecting the position, along the scanning direction, of the fine movement stage; a second measuring device for detecting the position, along the scanning direction, of the other one of the mask stage and the substrate stage; a speed controller for controlling the ratio between the speeds of the mask stage and the substrate stage to a predetermined value while the pattern on the mask is scanning-exposed on the substrate; and a control device for controlling the position of the fine movement stage in accordance with the difference between the position measured by the first measuring device and the position measured by the second measuring device during the scanning exposure.

51 Claims, 8 Drawing Sheets

SCANNING TYPE EXPOSURE APPARATUS

CROSS-REFERENCE TO RELATED APPLICATIONS

This application is a continuation of application Ser. No. 08/899,135 filed Jul. 23, 1997, now Abandoned, which is a division of application Ser. No. 08/464,369 filed Jun. 5, 1995, now U.S. Pat. No. 5,699,145, which is a continuation-in-part of application Ser. No. 08/274,037 filed Jul. 12, 1994 now Abandoned.

BACKGROUND OF THE INVENTION

1. Field of the Invention

The present invention relates to an exposure apparatus used in a photolithography process in the manufacture of, e.g., a semiconductor element, a liquid crystal display element, a thin-film magnetic head, or the like and, more particularly, to a scanning type exposure apparatus for transferring a pattern on a mask (or a reticle) onto a substrate by synchronously moving the mask and the substrate.

2. Related Background Art

In the photolithography process in the manufacture of semiconductor elements, a projection exposure apparatus for transferring a pattern formed on a mask or reticle (to be generally referred to as a "reticle" hereinafter) onto a substrate (wafer) coated with a photosensitive material (photoresist) via a projection optical system, in particular, a step-and-repeat type reduction production exposure apparatus (stepper), is popularly used. Recently, in association with an increase in size and a decrease in line width of semiconductor elements, it has been required to widen the image field of the projection optical system and to improve the resolution of the projection optical system. However, it is very difficult in terms of design and manufacture to realize both the high resolution and the wide field of the projection optical system. Thus, as disclosed in, e.g., U.S. Pat. Nos. 4,747,678, 4,924,257, 5,194,893, and 5,281,996, a scanning type exposure apparatus, which illuminates only a partial area having a predetermined shape (e.g., a rectangular shape, arcuate shape, hexagonal shape, rhombic shape, or the like) on a reticle with light, and exposes a pattern on the reticle onto a wafer by synchronously moving the reticle and wafer along a direction perpendicular to the optical axis of the -projection optical system, is receiving a lot of attention. In the scanning type exposure apparatus, even when the image field of the projection optical system is small, a large-area pattern image can be exposed onto the wafer, and the resolution of the projection optical system can be relatively easily improved.

FIG. 5A illustrates a conventional scanning type projection exposure apparatus. Referring to FIG. 5A, exposure light EL emerging from an illumination system IL illuminates an illumination area 32 on a reticle 12 at an even illuminance. A projection optical system 8 projects a pattern in the illumination area 32 on the reticle 12 onto a wafer 5. In scanning exposure, the reticle 12 is moved by a reticle stage RST at a speed $V_R$ in a $-Y$ direction (left direction in the plane of the drawing) with respect to the illumination area 32. In synchronism with this movement, the wafer 5 is moved by a wafer stage WST at a speed $V_W$ ($=\beta \times V_R$, $\beta$: the projection magnification of the projection optical system 8) in a $+Y$ direction (right direction in the plane of the drawing) with respect to a projection area (exposure area similar to the illumination area 32) 32W defined by the projection optical system 8. With these movements, a shot area SA on the wafer 5 is scanned in the Y direction with respect to the exposure area 32W, as shown in FIG. 5B, and the pattern image on the reticle 12 is scanning-exposed on the shot area SA.

FIG. 6 is a functional block diagram showing a control system of the scanning type exposure apparatus shown in FIG. 5A. Referring to FIG. 6, when a speed command signal indicating a scanning speed is input to a speed control system 61 for the wafer stage, the speed control system 61 drives the wafer stage WST in the Y direction, and performs speed control, so that the moving speed $V_W$ of the wafer stage WST coincides with the speed command. Normally, the position of the wafer stage WST is measured by a laser interferometer. However, in FIG. 6, a multiplier 66 multiplies a speed signal (a signal indicating the speed $V_W$) output from the speed control system 61 by $1/\beta$. Then, this speed signal from the multiplier 66 is supplied to an integrator 62, and the output signal from the integrator 62 is used as a position signal indicating a position $Y_W$, in the Y direction, of the wafer stage WST.

On the other hand, a speed signal (a signal indicating the speed $V_R$) output from a speed control system 64 for the reticle stage is supplied to an integrator 65, and the output signal from the integrator 65 is used as a position signal indicating a position $Y_R$, in the Y direction, of the reticle stage RST. The position signals from the integrators 62 and 65 are input to a subtracter 63, and a signal indicating a positional difference ($Y_W - Y_R$) output from the subtracter 63 is supplied to the speed control system 64. For the sake of simplicity, the projection magnification $\beta$ of the projection optical system 8 is set to be 1.

When the wafer stage WST begins to move by the speed control system 61 to follow the speed command signal, the signal which indicates the difference between the position $Y_R$ of the reticle stage RST and the position $Y_W$ of the wafer stage WST (the signal output from the subtracter 63) changes, and is supplied to the speed control system 64 to accelerate the reticle 12 in a direction indicated by the difference. The speed control system 64 comprises a PID controller (proportional, integral, derivative controller) having an integral function, and the like, and performs acceleration control of the reticle stage RST until the above-mentioned difference ($Y_W - Y_R$) becomes zero. Thus, the reticle 12 and the wafer 5 are synchronously scanned.

In the above-mentioned prior art (FIG. 6), the speed command signal is supplied to the speed control system 61 for the wafer stage, and the signal indicating the difference between the positions $Y_W$ and $Y_R$ of the wafer and reticle stages is supplied to the speed control system 64 for the reticle stage. Thus, after the movement of the wafer stage WST is detected, the scanning speed of the reticle stage RST is increased/decreased. For this reason, a time from acceleration of the reticle and wafer to the beginning of synchronous scanning is long.

SUMMARY OF THE INVENTION

It is an object of the present invention to provide a scanning type exposure apparatus which can shorten the time from acceleration of a mask and a substrate to the beginning of synchronous scanning for scanning exposure.

A first scanning type exposure apparatus according to the present invention, comprises an illumination system for illuminating a partial area on a mask (reticle) with light, a mask stage which is movable along a predetermined direction while holding the mask, and a substrate stage which is movable along the predetermined direction while holding a substrate. The apparatus transfers a pattern on the mask onto the substrate by synchronously driving the mask stage and the substrate stage. One of the mask stage and the substrate stage is provided with a fine movement stage which is movable relative to the one stage. The apparatus further comprises a first measuring device for measuring the position, along the predetermined direction, of the fine movement stage, a second measuring device for measuring the position, along the predetermined direction, of the other one of the mask stage and the substrate stage, a speed controller for controlling scanning speeds of the mask stage and the substrate stage, and a device for controlling the position of the fine movement stage (by a feedback method) in accordance with a difference between the position measured by the first measuring device and the position measured by the second measuring device.

As described above, according to the first apparatus of the present invention, the fine movement stage for finely adjusting the position of the mask or the substrate is arranged in addition to the mask stage and the substrate stage, which are used for moving the mask and the substrate at predetermined speeds. Since the speed controller simultaneously supplies a scanning speed command to the mask stage and the substrate stage, only an error caused by a difference between the response characteristics of speed control of the two stages appears as an error between the scanning speeds of the two stages. In contrast to this, in the conventional control method, a sum of a delay time caused by the speed control system for the mask stage and a delay time caused by the speed control system for the substrate stage appears in one of the mask stage and the substrate stage.

Furthermore, in order to prevent generation of an error between the relative positions of the mask and the substrate caused by a difference between the response characteristics of the speed control system on the side of the mask and the speed control system on the side of the substrate, the position of the fine movement stage is controlled by the feedback method in accordance with a difference between the position of the fine movement stage and the position of the stage not having the fine movement stage. With this control, a time from acceleration of the mask and the substrate to the beginning of synchronous scanning is shortened, and the throughput can be improved. In addition, since the moving distances of the stages before the synchronous scanning can be shortened, the strokes in the scanning directions of the stages can be shortened, and the apparatus can be rendered compact.

A second scanning type exposure apparatus according to the present invention, comprises an illumination system for illuminating a partial area on a mask with light, a mask stage which is movable along a predetermined direction while holding the mask, a substrate stage which is movable along the predetermined direction while holding a substrate, and a fine movement stage which is arranged on one of the mask stage and the substrate stage, and is movable relative to the one stage. The apparatus further comprises a first measuring device for measuring the position, along the predetermined direction, of the fine movement stage, a second measuring device for measuring the position, along the predetermined direction, of the other of the mask and substrate stages, which has no fine movement stage, and a third measuring device for measuring the position, along the predetermined direction, of the one stage which has the fine movement stage, a speed controller for controlling scanning speeds of the mask stage and the substrate stage. The apparatus additionally comprises a device for controlling the position of the fine movement stage (by a feedforward method) in accordance with a difference between a speed calculated from a change in position measured by the second measuring device and a speed calculated from a change in position measured by the third measuring device (i.e., a difference between the speeds of the mask stage and the substrate stage). The control device in the second scanning type exposure apparatus preferably controls the position of the fine movement stage using the difference between the position measured by the first measuring device and the position measured by the second measuring device as well as the above-mentioned difference between the speeds of the mask stage and the substrate stage.

As described above, according to the second apparatus of the present invention, since the speed controller simultaneously supplies a scanning speed command to the mask stage and the substrate stage, only an error caused by a difference between the response characteristics of speed control of the two stages appears as an error between the scanning speeds of the two stages. Furthermore, the position of the fine movement stage is controlled by the feedforward method in accordance with the difference between the scanning speeds of the mask stage and the substrate stage. With this control, a time from acceleration of the mask and the substrate to the beginning of synchronous scanning is shortened, and the throughput can be improved. In addition, since the moving distances of the stages before the synchronous scanning can be shortened, the strokes in the scanning directions of the stages can be shortened, and the apparatus can be rendered compact. Furthermore, since the position of the fine movement stage is controlled by simultaneously executing the feedback control according to the difference between the positions of the fine movement stage and the one of the mask stage and the substrate stage not provided with the fine movement stage, and the feedforward control according to the difference between the scanning speeds of the mask stage and the substrate stage, the time from acceleration of the mask and the substrate to the beginning of synchronous scanning can be further shortened.

A third scanning type exposure apparatus according to the present invention comprises a speed measuring device for measuring scanning speeds of a mask stage and a substrate stage, a speed setting device for generating a speed command signal corresponding to a target scanning speed of one of the mask stage and the substrate stage, at least, a speed controller for controlling scanning speeds of the mask stage and the substrate stage in accordance with a speed command signal from said speed setting device, and a filter member for eliminating predetermined frequency components from a signal based on the speed command signal supplied to the speed controller to which a signal corresponding to a relative speed difference between the mask stage and the substrate stage is added. In this case, an example of the predetermined frequency components to be eliminated by the filter member is at least a part of mechanical resonance frequency components of the mask stage and the substrate stage.

As described above, according to the third apparatus of the present invention, if, for example, a projection optical system with the projection magnification $\beta$ is used and the scanning speed of the mask stage is $V_R$, it is required to make the scanning speed $V_W$ of the substrate stage to be $\beta \cdot V_R$ when the substrate is scanning-exposed by a pattern image of the mask. Therefore, during the scanning exposure, a signal corresponding to a relative speed difference between the mask stage and the substrate stage (for example, a converted value $(V_W/\beta - V_R)$ in a reference frame of the mask) is calculated so that this signal is added to the signal based on the speed command signal supplied to the speed controller. In this manner, since the control is effected by the feedforward method, a time required for synchronous scanning of the mask stage and the substrate stage is shortened.

In addition, when the stage is driven at such speed as corresponding to the relative speed difference, a mechanical resonance or the like occurs on a part of the stage, which may cause instability in the operation. For this reason, the frequency components which may easily cause vibration such as the mechanical resonance frequency components mentioned above are eliminated by the filter member. For this reason, the mechanical resonance of the stage is decreased to suppress the vibration or the like so that the synchronous scanning can be performed stably. Further, since the filter member is provided, not in a feedback loop, but in a feedforward loop, the operation does not become unstable because of this filter member. As the filter member, a notch filter, a band eliminate filter or the like can be used.

A fourth scanning type exposure apparatus according to the present invention, comprises a mask stage for scanning a mask, a substrate stage for scanning a substrate, a fine movement stage for finely adjusting the position of the mask or the substrate, a speed measuring device for measuring scanning speeds of the mask stage and the substrate stage, a position measuring device for measuring positions of the mask and the substrate, a speed setting device for generating a speed command signal corresponding to a target scanning speed of one of the mask stage and the substrate stage, at least, a speed controller for controlling scanning speeds of the mask stage and the substrate stage in accordance with the speed command signal output from said speed setting device, a controller for controlling a speed of the fine movement stage on the basis of a speed command signal corresponding to a relative positional difference between the fine movement stage and the substrate stage, and a filter member for eliminating predetermined frequency components (for example, a mechanical resonance frequency component of the fine movement stage) from the speed command signal to be supplied to the controller to which a signal corresponding to a relative speed difference between the mask stage and the substrate stage is added.

As described above, according to the fourth apparatus of the present invention, there is further provided the fine movement stage for finely adjusting the position of the mask or the substrate, in addition to the mask stage and the substrate stage for respectively scanning the mask and the substrate at the predetermined speeds. In this case, as compared to the mask stage or the substrate stage, the fine movement stage can be easily made in a small size so that a response speed of the fine stage can be higher. Therefore, the speed of the fine movement stage is controlled on the basis of the relative positional difference and the relative speed difference as stated above, so that the time from a beginning of the scanning to the synchronous scanning can be shortened. Moreover, the filter member for eliminating the mechanical resonance frequency component of the fine movement stage is provided in the feedforward loop so as to eliminate the mechanical resonance frequency component from the speed command signal to be supplied to the controller in accordance with the relative speed difference. For this reason, even if the control is effected by using a signal corresponding to the relative speed difference, the mechanical resonance of the fine movement stage does not occur and the operation does not become unstable because of the filter member.

A fifth scanning type exposure apparatus according to the present invention, comprises a mask stage for scanning a mask, a substrate stage for scanning a substrate, a speed measuring device for measuring scanning speeds of the mask stage and the substrate stage, a position measuring device for measuring positions of the mask stage and the substrate stage, a speed setting device for generating a speed command signal corresponding to a target scanning speed of one of the mask stage and the substrate stage, at least, a speed controller for controlling scanning speeds of the mask stage and the substrate stage on the basis of the speed command signal to be output from said speed setting device, a positional information returning portion for regulating a speed command signal for the other of the mask stage and the substrate stage by using a signal corresponding to a relative positional difference between the mask stage and the substrate stage, and a speed information returning portion for adding a signal corresponding to the relative speed difference between the mask stage and the substrate stage to one of the speed command signals.

In one example of the fifth apparatus of the present invention, the scanning speed of the substrate stage is controlled on the basis of the speed command signal from the speed setting device. Then, the signal corresponding to the relative positional difference between the mask stage and the substrate stage is returned to regulate a speed command signal of the mask stage by the positional information returning portion. Further, the signal corresponding to the relative speed difference between mask stage and the substrate stage is returned (fed forward or fed back) to regulate a speed command signal of the mask stage or the substrate stage by the speed information returning portion. Therefore, as compared to the conventional example in which only a signal corresponding to the relative positional difference is returned, the time required for a beginning of the synchronous scanning can be shortened.

DESCRIPTION OF THE PREFERRED EMBODIMENTS

Figure 1:
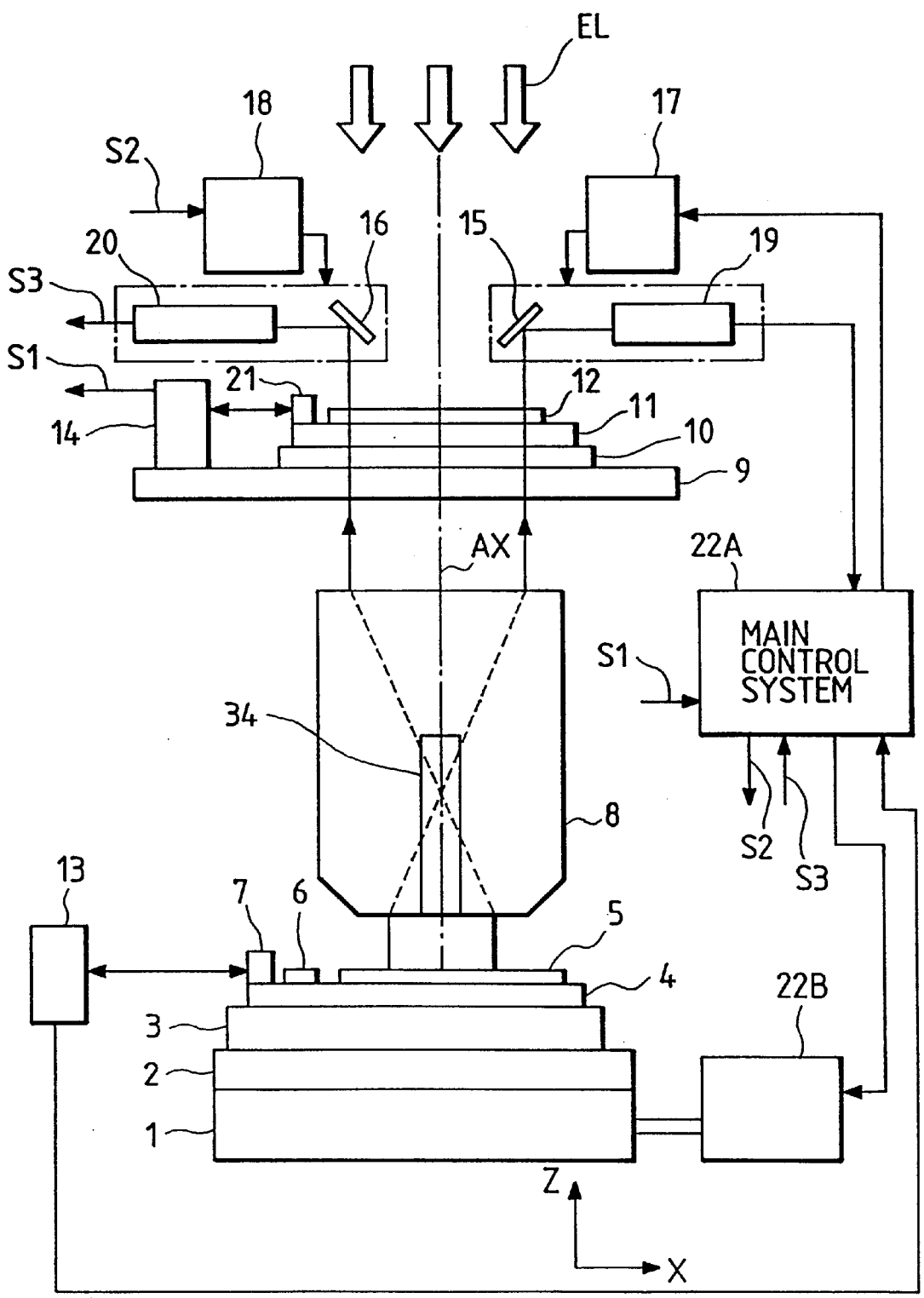
FIG. 1 is a schematic side view showing the arrangement of a scanning type projection exposure apparatus according to an embodiment of the present invention.

A scanning type projection exposure apparatus according to an embodiment of the present invention will be described below with reference to FIGS. 1 to 4. FIG. 1 shows the schematic arrangement of a scanning type projection exposure apparatus according to this embodiment. Referring to FIG. 1, exposure light EL from an illumination optical system (not shown) is radiated onto only an elongated local rectangular area on a reticle 12. The exposure light EL transmitted through the reticle 12 is incident on a projection optical system 8, and the projection optical system 8 projects an image of a pattern on the reticle 12 onto a wafer 5. In scanning exposure, the reticle 12 is scanned with respect to the illumination area of the exposure light EL at a constant speed $V_R$ in a forward direction (−Y direction) perpendicular to the plane of the drawing of FIG. 1. In synchronism with this movement, the wafer 5 is scanned at a constant speed $\beta \times V_R$ ($\beta$ is the projection magnification of the projection optical system 8) in a backward direction (+Y direction) perpendicular to the plane of the drawing of FIG. 1.

Driving systems of the reticle 12 and the wafer 5 will be described below. A rough movement stage 10 (mask stage), which is movable in only the Y direction (a direction perpendicular to the plane of the drawing of FIG. 1), is arranged on a support table (base) 9, and a fine movement stage 11 is placed on the rough movement stage 10 to constitute a mask stage unit. The reticle 12 is held on the fine movement stage 11 via, e.g., a vacuum chuck. The fine movement stage 11 is finely movable in the X and Y directions and a rotational direction (θ direction) in a plane perpendicular to an optical axis AX of the projection optical system 8, and performs position control of the reticle 12 with high accuracy. A movable mirror 21 is arranged on the fine movement stage 11, and the positions, in the X, Y, and e directions, of the fine movement stage 11 are always monitored by a laser interferometer 14 arranged on the base 9. Position information Si from the interferometer 14 is supplied to a main control system 22A. As will be described later, in this embodiment, the position, in the Y direction (scanning direction) of the rough movement stage 10 is always measured by an interferometer (see FIG. 2B).

On the other hand, a wafer or substrate stage unit includes a Y stage 2, which is movable in the Y direction, and placed on a support table (base) 1, and an X stage 3, which is movable in the X direction and placed on the Y stage 2. Furthermore, a ZL stage 4, which is finely movable in the direction of the optical axis AX and is arbitrarily tiltable with respect to a plane perpendicular to the optical axis AX, is arranged on the X stage, and the wafer 5 is held on the ZL stage 4 via a vacuum chuck (e table; not shown). A movable mirror 7 is fixed on the ZL stage 4, and the positions, in the X, Y, and e directions, of the ZL stage 4 are monitored by an externally arranged interferometer 13. Position information from the interferometer 13 is also supplied to the main control system 22A. The main control system 22A controls the alignment operations of the Y stage 2, the X stage 3, and the ZL stage 4 via a driver 22B, and the like, and systematically controls the entire apparatus.

In order to establish a correspondence between a wafer coordinate system defined by the interferometer 13 and a reticle coordinate system defined by the interferometer 14, a reference mark plate 6 is fixed at a position, near the wafer 5, on the ZL stage 4. Various reference marks are formed on the reference mark plate 6. One of these reference marks is illuminated, from its back surface side, with illumination light (exposure light) guided to the interior of the ZL stage 4, as disclosed in, e.g., U.S. Pat. No. 4,780,616.

Alignment microscopes 19 and 20 for simultaneously observing the reference marks on the reference mark plate 6 and marks on the reticle 12 are disposed above the reticle 12. Also, mirrors 15 and 16 for guiding detection light from the reticle 12 to the alignment microscopes 19 and 20 are movably arranged. When an exposure sequence is started, drivers 17 and 18 retract the mirrors 15 and 16 to positions outside exposure optical paths in accordance with a command from the main control system 22A. Furthermore, an off-axis type alignment device 34 for observing alignment marks (wafer marks) on the wafer 5 is arranged on the side surface portion, in the Y direction, of the projection optical system 8. A detailed description of the alignment device 34 will be omitted since it is disclosed in, e.g., U.S. Pat. No. 4,962,318.

Figure 2A:
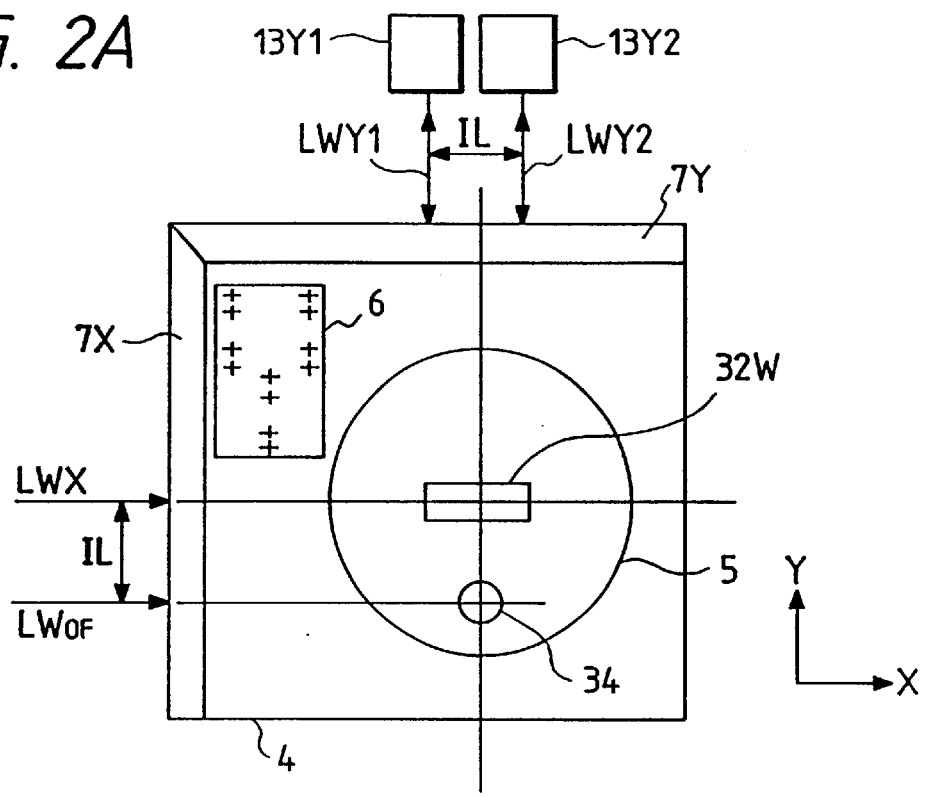
FIG. 2A is a plan view showing the arrangement of a wafer stage shown in FIG. 1.

The detailed arrangements of the wafer stage and the reticle stage will be described below with reference to FIGS. 2A and 2B. FIG. 2A shows the wafer stage. The wafer 5 is held on the ZL stage 4, and the reference mark plate 6 and movable mirrors 7X and 7Y are also arranged on the stage 4. The image of the pattern on the reticle 12 is projected by the projection optical system 8 onto an elongated rectangular exposure area 32W on the wafer 5, which area is similar to the illumination area on the reticle 12.

Referring to FIG. 2A, the movable mirror 7X has a reflection surface extending in the Y direction, and is irradiated with laser beams LWX and $LW_{OF}$ from two X-axis interferometers (not shown) for detecting the position, in the X direction, of the ZL stage 4. The two laser beams LWX and $LW_{OF}$ are separated by an interval IL, are parallel to each other in the X direction, and respectively pass through the optical axis of the projection optical system 8 and a reference point (detection center) of the alignment device 34. On the other hand, the movable mirror 7Y has a reflection surface extending in the X direction, and is irradiated with laser beams LWY1 and LWY2 from two Y-axis interferometers 13Y1 and 13Y2. The laser beams LWY1 and LWY2 are separated by the interval IL and are parallel to each other in the Y direction.

As the X-coordinate of the ZL stage 4, a coordinate value measured by the X-axis interferometer using the laser beam LWX is used, and as the Y-coordinate of the ZL stage 4, an average value $(Y_{W1}+Y_{W2})/2$ of a coordinate value $Y_{W1}$ measured by the interferometer 13Y1 and a coordinate value $Y_{W2}$ measured by the interferometer 13Y2 is used. In addition, the rotation error (direction and amount) of the ZL stage 4 is calculated on the basis of, e.g., the difference between the coordinate values $Y_{W1}$ and $Y_{W2}$ and the interval IL. Based on these coordinate values, the scanning speed, the position, and the rotational angle, in the XY-plane, of the ZL stage 4 are controlled. In particular, since the moving direction of the ZL stage 4 upon scanning exposure is the Y direction, the average value of the measurement results of the two interferometers 13Y1 and 13Y2 is used in the Y direction, thereby preventing deterioration of accuracy caused by, e.g., inclination upon scanning exposure. The off-axis type alignment device 34 utilizes the measurement value of the X-axis interferometer which does not cause an Abbe's error and uses the laser beam $LW_{OF}$.

Figure 2B:
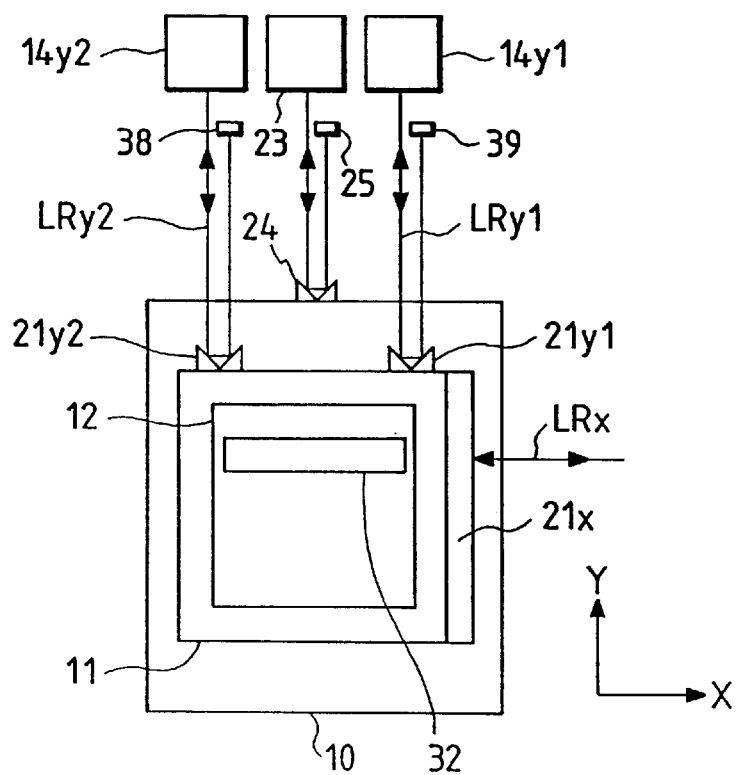
FIG. 2B is a plan view showing the arrangement of a reticle stage shown in FIG. 1.

FIG. 2B shows the reticle stage. The fine movement stage 11 is placed on the rough movement stage 10, and the reticle 12 is held on the stage 11. On the fine movement stage 11, a movable mirror 21x having a reflection surface which extends in the Y direction and is irradiated with a laser beam LRx from an X-axis interferometer (not shown) for detecting the position in the X direction, and movable mirrors 21y1 and 21y2 which are irradiated with laser beams LRy1 and LRy2 from two Y-axis interferometers 14y1 and 14y2 for detecting the position in the Y direction, are arranged. As the Y-coordinate of the fine movement stage 11, an average value $(Y_{R1}+Y_{R2})/2$ of a coordinate value $Y_{R1}$ measured by the interferometer 14y1 and a coordinate value $Y_{R2}$ measured by the interferometer 14y2 is used, and as the X-coordinate, a coordinate value measured by the X-axis interferometer using the laser beam LRx is used. Furthermore, a rotational error (direction and amount) of the fine movement stage 11 is calculated from, e.g., the difference between the coordinate values $Y_{R1}$ and $Y_{R2}$.

As the movable mirrors 21y1 and 21y2, corner cube type reflection elements are used. The laser beams LRy1 and LRy2 reflected by the movable mirrors 21y1 and 21y2 are respectively reflected by stationary mirrors 39 and 38, and return to the movable mirrors 21y1 and 21y2. More specifically, the Y-axis interferometers 14y1 and 14y2 are double-pass type interferometers, and can prevent position shifts of laser beams even when the fine movement stage 11 is rotated. A rectangular area 32 on the reticle 12 is illuminated with exposure light EL at an even illuminance.

Furthermore, a corner cube type movable mirror 24 is fixed at an end portion, in the Y direction, of the rough movement stage 10. A laser beam from a Y-axis interferometer 23 for the rough movement stage is reflected by the movable mirror 24 toward a stationary mirror 25, and the laser beam reflected by the stationary mirror 25 returns to the interferometer 23 via the movable mirror 24. More specifically, the interferometer 23 always monitors a coordinate $Y_{R3}$, in the Y direction, of the rough movement stage 10 by a double-pass method. The fine movement stage 11 is finely movable by an actuator (not shown) in the X, Y, and θ directions relative to the rough movement stage 10.

Figure 3:
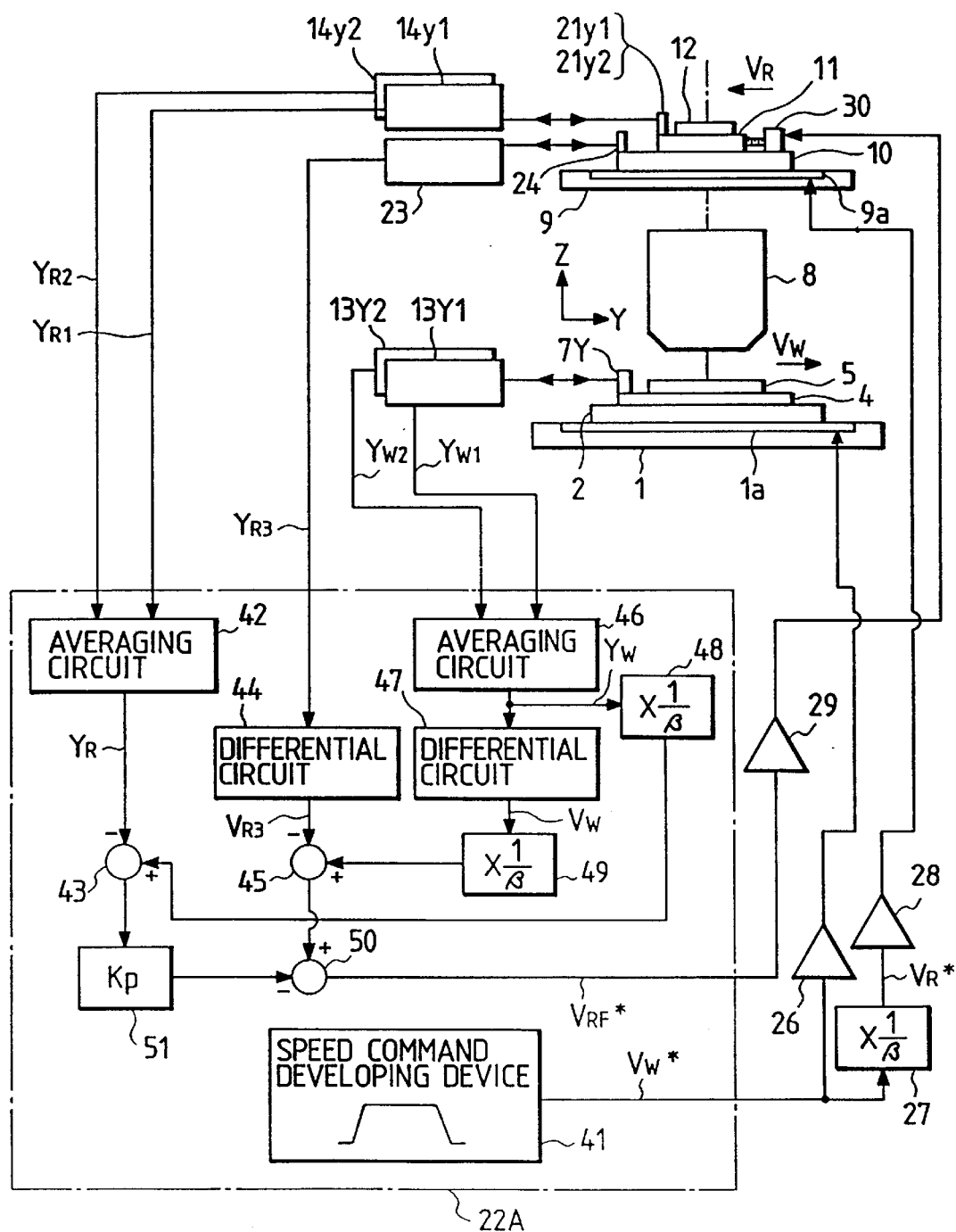
FIG. 3 is a block diagram showing a control system of the apparatus shown in FIG. 1.

FIG. 3 shows a control system of the apparatus (FIG. 1) of this embodiment. Referring to FIG. 3, the rough movement stage 10 is driven by a linear motor 9a along the Y direction with respect to a base 9, and the fine movement stage 11 is driven by a motor 30 along the Y direction with respect to the rough movement stage 10. The Y-coordinates $Y_{R1}$ and $Y_{R2}$ of the fine movement stage 11 measured by the interferometers 14y1 and 14y2, and the Y-coordinate $Y_{R3}$ of the rough movement stage 10 measured by the interferometer 23 are supplied to the main control system 22A. On the other hand, the Y stage 2 for the wafer 5 is driven by a linear motor 1a along the Y direction with respect to the base 1, and the Y-coordinates $Y_{W1}$ and $Y_{W2}$ of the Y stage 2 measured by the interferometers 13Y1 and 13Y2 are supplied to the main control system 22A.

In the main control system 22A, a speed command developing device 41 reads out information of a target scanning speed $V_W^*$ of the wafer stage stored in a memory in synchronism with a predetermined clock signal, and supplies the readout speed information to a power amplifier 26 and a multiplier 27. The power amplifier 26 controls the driving operation of the linear motor 1a, so that the rough movement stage 2 is driven in the Y direction at the target scanning speed $V_W^*$. The multiplier 27 supplies, to a power amplifier 28, information of a target scanning speed $V_R^*$ obtained by multiplying the target scanning speed $V_W^*$ with the reciprocal (1/β) of the projection magnification β of the projection optical system 8. More specifically, the target scanning speed $V_R^*$ of the reticle stage is set to be $V_W^*/\beta$. For example, the projection magnification β is set to be ¼. The power amplifier 28 controls the driving operation of the linear motor 9a, so that the rough movement stage 10 is driven at the target scanning speed $V_R^*$ in the −Y direction.

In the main control system 22A, a coordinate $Y_R$ obtained by averaging the Y-coordinates $Y_{R1}$ and $Y_{R2}$ of the fine movement stage 11 by an averaging circuit 42 is supplied to a subtracter 43. Also, the Y-coordinate $Y_{R3}$ of the rough movement stage 10 is supplied to a differential circuit 44, and the differential circuit 44 calculates the difference of the coordinate $Y_{R3}$ from the average value at a predetermined cycle, thereby calculating a scanning speed $V_{R3}$, in the −Y direction, of the rough movement stage 10. The differential circuit 44 supplies the scanning speed $V_{R3}$ to a subtracter 45. Parallel to these operations, a coordinate $Y_W$ obtained by averaging the Y-coordinates $Y_{W1}$ and $Y_{W2}$ of the Y stage 2 by an averaging circuit 46 is supplied to a differential circuit 47 and a multiplier 48. The differential circuit 47 calculates the difference of the coordinate $Y_W$ from the average value at a predetermined cycle, thereby calculating a scanning speed $V_W$, in the Y direction, of the Y stage 2. The circuit 47 supplies the scanning speed $V_W$ to a multiplier 49. The multiplier 49 supplies a scanning speed $V_W/\beta$ obtained by multiplying the scanning speed $V_W$ with the reciprocal (1/β) of the projection magnification p to the subtracter 45, and the multiplier 48 supplies a coordinate value $Y_W/\beta$ obtained by multiplying the Y-coordinate $Y_W$ with the reciprocal (1/β) to the subtracter 43.

The subtracter 43 supplies the difference $\{(Y_W/\beta)-Y_R\}$ between the Y-coordinate $Y_W/\beta$ of the Y stage 2 and the Y-coordinate $Y_R$ of the fine movement stage 11 on the reticle to a multiplier 51. The multiplier 51 multiplies the difference with a constant $K_P$ to calculate a position gain, and supplies this information to a subtracter 50. The subtracter 45 supplies speed difference information representing the difference $\{(V_W/\beta)-V_{R3}\}$ between the scanning speed $V_W/\beta$ of the Y stage 2 and the scanning speed $V_{R3}$ of the rough movement stage 10 on the reticle to the subtracter 50. The subtracter 50 subtracts the position gain information of the multiplier 51 from the speed difference information of the subtracter 45 to calculate a target scanning speed $V_{RF}^*$, and supplies a signal representing this target scanning speed $V_{RF}^*$ to the motor 30 via the power amplifier 29.

The motor 30 drives the fine movement stage 11 at the target scanning speed $V_{RF}^*$ in the −Y direction with respect to the rough movement stage 10, and the target scanning speed $V_{RF}^*$ is given by:

$$V_{RF}^* = \{(V_W/\beta) - V_{R3}\} - K_P\{(Y_W/\beta) - Y_R\} \tag{1}$$

More specifically, the target scanning speed $V_{RF}^*$ of the fine movement stage 11 relative to the rough movement stage 10 in the −Y direction is set to be a speed which brings the difference between the speeds of the Y stage 2 and the rough movement stage 10 on the reticle 12, and the difference between the positions of the fine movement stage 11 and the Y stage 2 on the reticle 12 close to zero.

Before the pattern on the reticle 12 is transferred onto the wafer 5, the alignment microscopes 19 and 20 measure, in advance, the positional relationship between the reticle 12 and the reference mark plate 6 on the wafer stage, and the alignment device 34 measures the positional relationship between a shot area on the wafer 5 and the reference mark plate 6. When the pattern on the reticle 12 is transferred onto the shot area on the wafer 5, the measurement values of the reticle-side interferometers 14y1, 14y2, and 23, and the measurement values of the wafer-side interferometers 13Y1 and 13Y2 are respectively reset to zero upon alignment of the pattern on the reticle 12 to the shot area on the wafer 5. In addition, the polarity of the reticle-side interferometers on is set so that their count values increase when the reticle 12 moves in the −Y direction, and the polarity of the wafer-side interferometers on is set so that their count values increase when the wafer 5 moves in the +Y direction. Thereafter, synchronous scanning of the reticle 12 and the wafer 5 is performed by the control system shown in FIG. 3.

Figure 4:
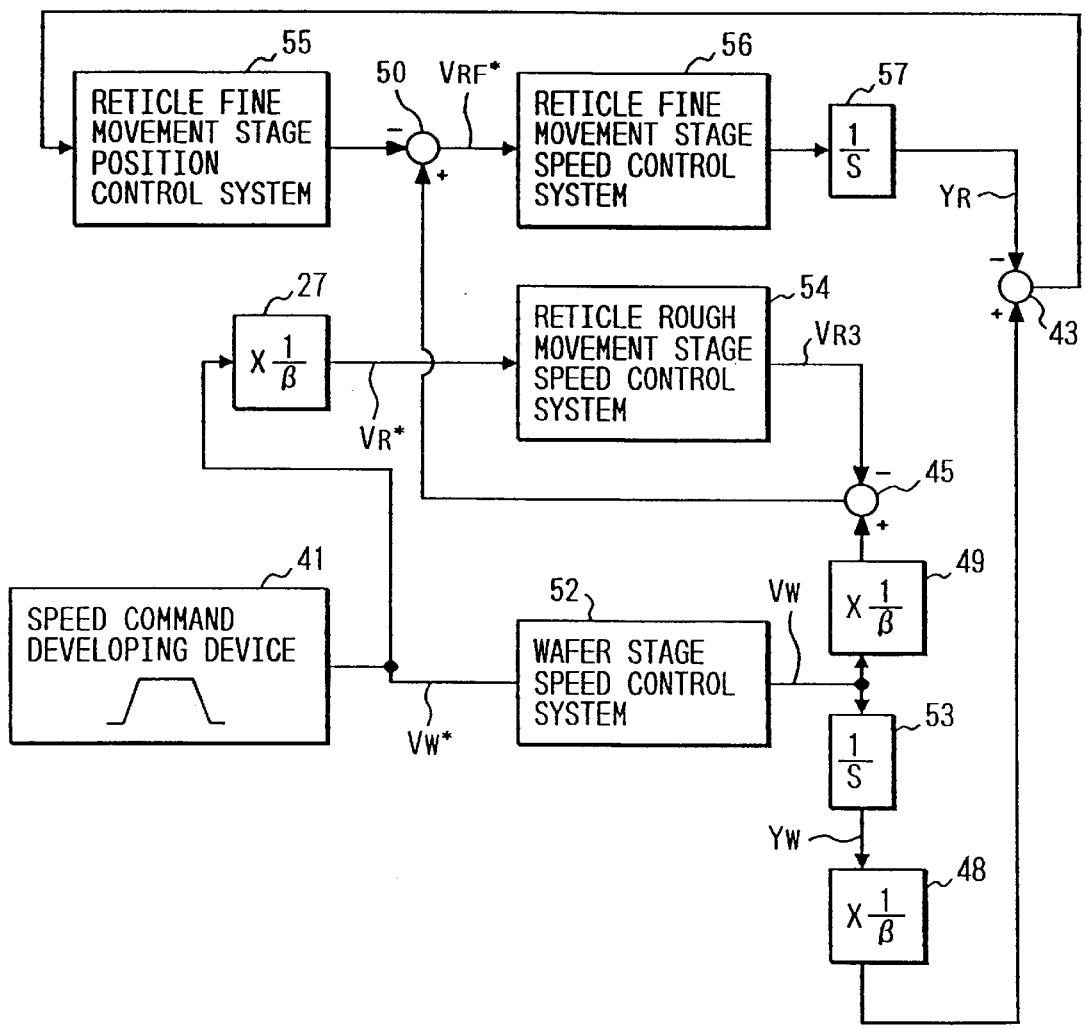
FIG. 4 is a functional block diagram showing a control system of stages in FIG. 1.
Figure 5A:
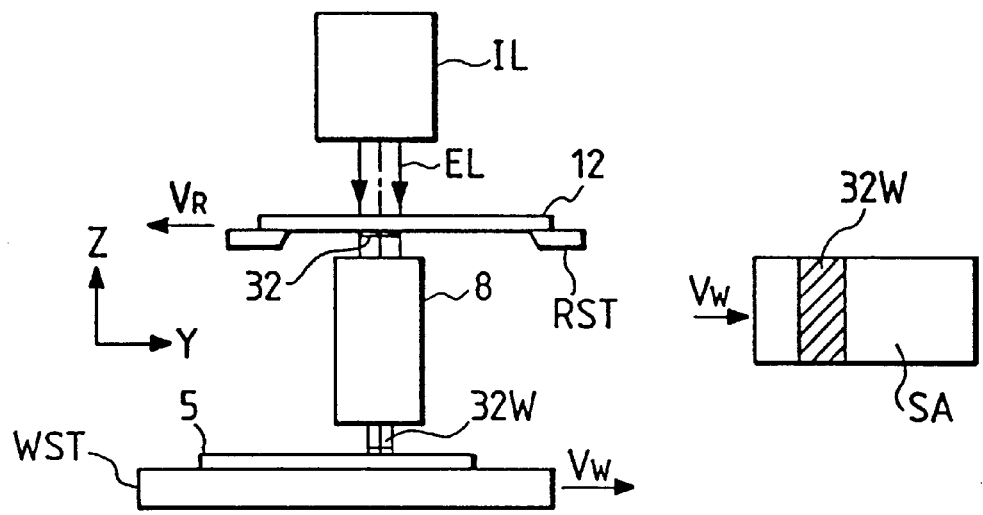
FIG. 5A is a schematic side view showing a conventional scanning type projection exposure apparatus.
Figure 5B:
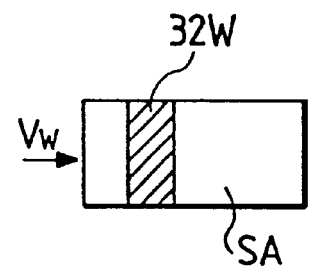
FIG. 5B is an enlarged view showing a shot area on a wafer shown in FIG. 5A.
Figure 6:
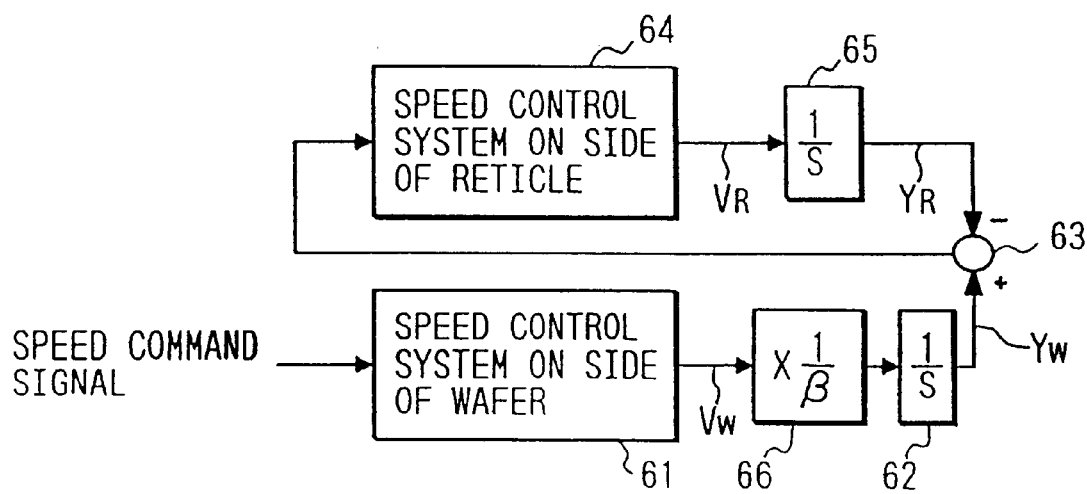
FIG. 6 is a functional block diagram showing a control system of stages of the conventional scanning type projection exposure apparatus.

FIG. 4 is a functional block diagram of the control system of this embodiment in correspondence with the format of the functional block diagram in FIG. 6 showing the conventional control system. The same reference numerals in FIG. 4 denote corresponding parts in FIG. 3, and the operation of the entire control system for the reticle stage and the wafer stage of this embodiment will be described below with reference to FIG. 4.

Referring to FIG. 4, information representing the target scanning speed $V_W^*$ of the wafer stage output from the speed command developing device 41 is supplied to the multiplier 27, which multiplies the input data with the reciprocal $(1/\beta)$ of the projection magnification, and a wafer stage speed control system 52. Information representing the scanning speed $(V_W^*/\beta)$ output from the multiplier 27 is supplied to a rough movement stage speed control system 54. The speed control system 52 is a control system of the scanning speed for the Y stage 2 in FIG. 3, and the speed control system 54 is a control system of the scanning speed for the rough movement stage 10 in FIG. 3. With these control systems, the Y stage 2 and the rough movement stage 10 are simultaneously accelerated. Since the reticle 11 is placed on the rough movement stage 10 via the fine movement stage 11, the fine movement stage 11 and the reticle 12 are also accelerated at the same time.

Furthermore, in FIG. 4, the scanning speed $V_{R3}$, in the $-Y$ direction, of the rough movement stage 10 measured by the speed control system 54 is supplied to the subtracter 45, and the scanning speed $V_W$, in the Y direction, of the Y stage 2 measured by the speed control system 52 is supplied to the multiplier 49 and an integrator 53. Note that the positions of the stages are measured by the interferometers in the embodiment shown in FIG. 3, but FIG. 4 expresses, for the sake of simplicity, that the speeds are measured, following the custom of the block diagram.

Information of the scanning speed $(V_W/\beta)$ output from the multiplier 49 is supplied to the subtracter 45, and information representing the difference $\{(V_W/\beta)-V_{R3}\}$ of the scanning speeds output from the subtracter 45 is supplied to the subtracter 50. Position information obtained by multiplying the scanning position $Y_W$, in the Y direction, of the Y stage 2 output from the integrator 53 with the reciprocal $(1/\beta)$ of the projection magnification is supplied by the multiplier 48 to the subtracter 43. Information of the position $Y_R$, in the $-Y$ direction, of the fine movement stage 11 output from an integrator 57 connected to a fine movement stage speed control system 56 (to be described later) is also supplied to the subtracter 43. Information of the difference $\{(Y_W/\beta)-Y_R)\}$ between the positions output from the subtracter 43 is supplied to a fine movement stage position control system 55. The position control system 55 comprises the multiplier 51 for multiplying input information with the position gain constant $K_P$ in FIG. 3, and supplies information of the difference $K_P \times \{(Y_W/\beta)-Y_R\}$ to the subtracter 50.

Information representing the target scanning speed $V_{RF}^*$ output from the subtracter 50 is supplied to the fine movement stage speed control system 56. The speed control system 56 executes control so that the scanning speed of the fine movement stage 11 in FIG. 3 follows the target scanning speed $V_{RF}^*$, and the target scanning speed $V_{RF}^*$ is given by equation (1) above. Therefore, in this embodiment, since the speed command is parallelly supplied to the wafer stage speed control system 52 and the reticle rough movement stage speed control system 54, a delay of one of the Y stage 2 and the rough movement stage 10 can be prevented.

The reticle 12 is placed on the rough movement stage 10 via the fine movement stage 11, and the driving control of the fine movement stage 11 is achieved by feedback control of the difference between the scanning positions of the Y stage 2 and the fine movement stage 11 on the reticle. Furthermore, the driving control of the fine movement stage 11 is also achieved by feedforward control of the difference between the scanning speeds of the Y stage 2 for the wafers and the rough movement stage 10 for the reticle. Therefore, the time from the beginning of the scanning to the beginning of synchronous scanning of the reticle 12 and the wafer 5 can be shortened, and the throughput of the exposure process can be improved. In addition, since the moving distances (running distances) required before synchronous scanning are shortened, the strokes, along the Y direction, of the Y stage 2 and the rough movement stage 10 can be shortened, and the entire apparatus can be rendered compact.

Note that the operations of the respective elements in the main control system 22A in FIG. 3 may be executed in a software manner. Components from the wafer stage speed control system 52 to the fine movement stage position control system 55 in FIG. 4 may be constituted by conventional PID controllers (proportional, integral, and derivative controllers), or controllers which are subjected to phase advance/delay compensation. The gain constants (e.g., the position gain constant $K_P$) of the control systems are determined by the mechanical constants of the stages.

In FIG. 3, the reticle 12 is placed on the rough movement stage 10 via the fine movement stage 11. As another example, a fine movement stage, which is movable at least along the Y direction relative to the Y stage 2, may be arranged on the Y stage 2, and the wafer 5 may be placed on this fine movement stage. The fine movement stage need not always be arranged between the rough movement stage 10 and the reticle 12 or between the Y stage 2 and the wafer 5. For example, the rough movement stage 10 or the Y stage 2 may be arranged on the fine movement stage, and the fine movement stage may finely move the rough movement stage 10 and the reticle 12 or the Y stage 2 and the wafer 5 integrally along the scanning direction (Y direction in this embodiment). Furthermore, fine movement stages may be arranged on both the sides of the reticle 12 and the wafer 5.

Moreover, in this embodiment, the positions of the stages are measured by utilizing the interferometers. As another example, the moving speeds of the stages may be measured using speed sensors (or acceleration sensors). When heterodyne laser interferometers are used, since these interferometers detect the moving speeds of objects and the moving distance is calculated by integrating the moving speeds, speed information output from the laser interferometers may be directly used as the moving speeds of the stages.

Figure 7:
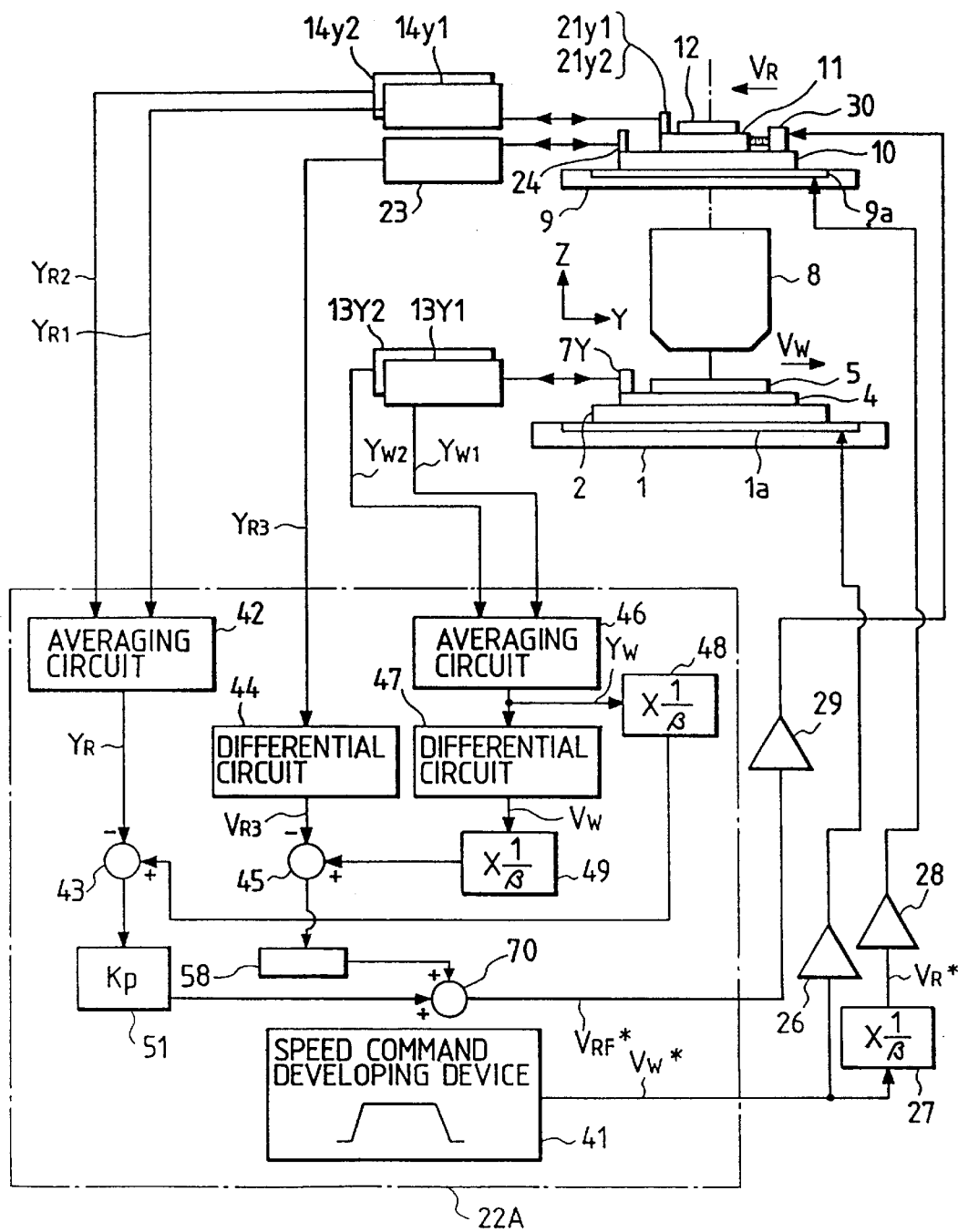
FIG. 7 is a block diagram of a control system of a scanning type projection exposure apparatus according to the second embodiment of the present invention.
Figure 8:
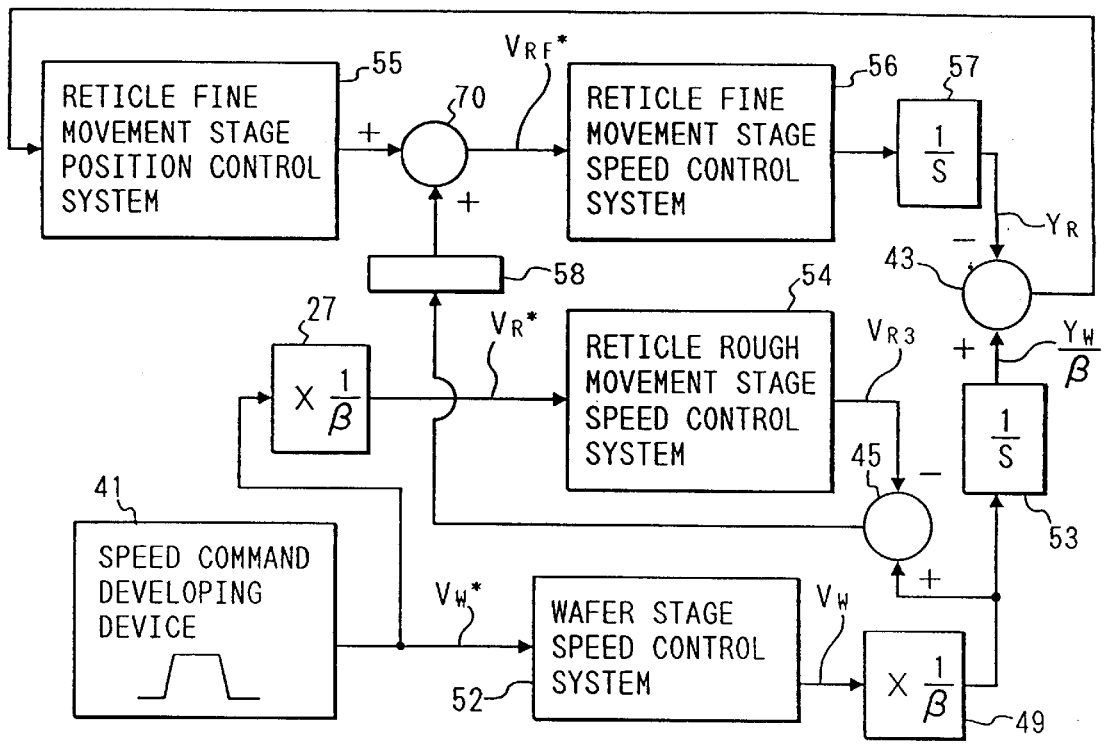
FIG. 8 is a functional block diagram showing a control system of stages in FIG. 7.

Next, the second embodiment of the present invention will be described with reference to FIGS. 7 and 8. A scanning type projection exposure apparatus according to the present embodiment is almost the same as that according to the first embodiment shown in FIGS. 1, 2A, and 2B, except that the arrangement of the control system of the apparatus differs. Thus, only the above-mentioned difference will be described here. FIG. 7 is a block diagram of a control system of the scanning type projection exposure apparatus according to the present embodiment. In FIG. 7, the components identical to those in FIG. 3 are given the same reference numerals. FIG. 8 is a functional block diagram of, a control system of the stages shown in FIG. 7, and in FIG. 8, the components identical to those in FIG. 4 are given the same reference numerals.

According to the present embodiment, as shown in FIG. 7, a notch filter circuit 58 is additionally provided in the control system (FIG. 3) of the first embodiment, and an adder 70 is arranged instead of the subtracter 50 in FIG. 3, which are the differences between the present embodiment (FIG. 7) and the first embodiment (FIG. 3).

Referring to FIG. 7, the subtracter 43 supplies the difference $\{(Y_W/\beta)-Y_R\}$ between the Y-coordinate $Y_W/\beta$ of the Y stage 2 in the reference frame of the reticle and the Y-coordinate $Y_R$ of the fine movement stage 11 to the multiplier 51. The multiplier 51 multiplies this difference by the constant $K_P$ to calculate a position gain, and supplies this information (a gain signal) to the adder 70 as a speed command signal. The subtracter 45 supplies a speed command signal corresponding to the difference $\{(V_W/\beta)-V_{R3}\}$ between the scanning speed $V_W/\beta$ of the Y stage 2 in the reference frame of the reticle and the scanning speed $V_{R3}$ of the rough movement stage 10 to the notch filter circuit 58. The notch filter circuit 58 eliminates the mechanical resonance frequency component of the fine movement stage 11 from the supplied speed command signal, and supplies this speed command signal without the frequency component to the adder 70.

Figure 9A:
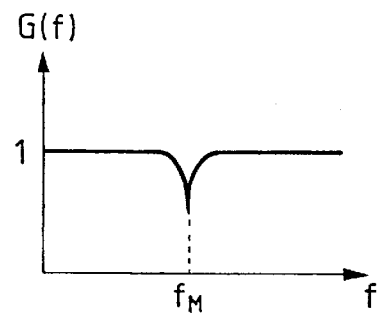
FIG. 9A is a view showing frequency characteristics of a notch filter in FIG. 7.
Figure 9B:
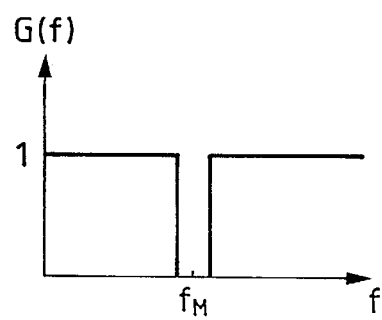
FIG. 9B is a view showing frequency characteristics of a band elimination filter.

More specifically, the notch filter circuit 58 has filter characteristics, as shown in FIG. 9A, for making the mechanical resonance frequency $f_M$ of the fine movement stage 11 to be the notch frequency. The mechanical resonance frequency $f_M$ of the fine movement stage 11 is, for example, 200 Hz or around. Note that, instead of the notch filter circuit 58, it is possible to use a band elimination filter (BEF) or the like which eliminates an input signal in a frequency area of a predetermined bandwidth including the mechanical resonance frequency $f_M$, as shown in FIG. 9B.

The adder 70 adds the speed command signal from the notch filter circuit 58 and the speed command signal (the position gain information) from the multiplier 51 together so as to calculate a speed command signal corresponding to the target scanning speed $V_{RF}^*$, and supplies this speed command signal corresponding to the target scanning speed $V_{RF}^*$ to the motor 30 via the power amplifier 29. The motor 30 drives the fine movement stage 11 at the target scanning speed $V_{RF}^*$ in the –Y direction with respect to the rough movement stage 10. The target scanning speed $V_{RF}^*$ is given by equation (1) above. That is, the target scanning speed is expressed by:

$$V_{RF}^*=\{(V_W/\beta)-V_{R3}\}-K_P\{(Y_W/\beta)-Y_R\}$$

More specifically, the target scanning speed $V_{RF}^*$ of the fine movement stage 11 relative to the rough movement stage 10 in the –Y direction is set to be a speed which brings the difference between the speeds of the Y stage 2 for the wafer 5 and the rough movement stage 10 for the reticle 12 and the difference between the positions of the fine movement stage 11 and the Y stage 2 for the reticle 12 close to zero.

Next, description will be made on the operation of the entire control system for the reticle stage and the wafer stage according to the present embodiment with reference to FIG. 8.

Referring to FIG. 8, a speed command signal representing a target scanning speed $V_W^*$ of the wafer stage output from the speed command developing device 41 is supplied to the multiplier 27 which multiplies the input signal with the reciprocal $(1/\beta)$ of the projection magnification, and the wafer stage speed control system 52. Information representing the scanning speed $(V_W^*/\beta)$ output from the multiplier 27 is supplied to the rough movement stage speed control system 54. The speed control system 52 is a control system of the scanning speed for the Y stage 2 in FIG. 7, and the speed control system 54 is a control system of the scanning speed for the rough movement stage 10 in FIG. 7. With these control systems, the Y stage 2 and the rough movement stage 10 are simultaneously accelerated. Since the reticle 12 is placed on the rough movement stage 10 via the fine movement stage 11, the fine movement stage 11 and the reticle 12 are also accelerated at the same time.

Furthermore, the scanning speed $V_{R3}$, in the –Y direction, of the rough movement stage 10 measured by the speed control system 54 is supplied to the subtracter 45, and the scanning speed $V_W$, in the Y direction, of the Y stage 2 measured by the speed control system 52 is supplied to the multiplier 49. Note that the positions of the stages are measured by the interferometers in the embodiment shown in FIG. 7, but FIG. 8 expresses, for the sake of simplicity, that the speeds are measured, following the custom of the block diagram. As noted earlier in connection with FIG. 3, a laser interferometer of the heterodyne type first measures a moving speed of an object to be measured, integrates the moving speed, and calculates a moving distance. Therefore, in the embodiment shown in FIG. 7, such arrangement can be employed as to measure a speed first and then calculate a position by integrating this speed.

A speed command signal corresponding to the scanning speed $(V_W/\beta)$ output from the multiplier 49 is supplied to the subtracter 45 and the integrator 53. A speed command signal corresponding to the difference $\{(V_W/\beta)-V_{R3}\}$ between the scanning speeds output from the subtracter 45 is supplied to the adder 70 via the notch filter circuit 58. Also, a signal corresponding to the position $(Y_W/\beta)$ in the Y direction (converted on to the reference frame of the reticle) of the Y stage 2 which is output from the integrator 53 is supplied to the subtracter 43. The scanning speed $V_R$ in the –Y direction of the fine movement stage 11 output from a fine movement stage speed control system 56 which is described later is integrated by the integrator 57, and a signal corresponding to the position $Y_R$ obtained here is supplied to the subtracter 43. A signal representing the positional difference $\{(Y_W/\beta)-Y_R\}$ output from the subtracter is supplied to the fine movement stage position control system 55. The position control system 55 in FIG. 7 consists of the multiplier 51 which multiplies an input signal with the position gain constant $K_P$, and a speed command signal (a position gain signal) corresponding to the difference $K_P\times\{(Y_W/\beta)-Y_R\}$ output from the position control system 55 is supplied to the adder 70.

A speed command signal corresponding to the target scanning speed $V_{RF}^*$ output from the adder 70 is supplied to the fine movement stage speed control system 56. This speed control system 56 executes control so that the scanning speed of the fine movement stage 11 follows the target scanning speed $V_{RF}^*$, and the target scanning speed $V_{RF}^*$ is given by equation (1) above. Therefore, in the present embodiment, since the speed command is supplied to the wafer stage speed control system 52 and the reticle rough movement stage speed control system 54 in parallel, a delay of one of the Y stage 2 and the rough movement stage 10 can be prevented.

The reticle 12 is placed on the rough movement stage 10 via the fine movement stage 11, and the driving control of the fine movement stage 11 is achieved by feedback control of the difference between the positions of the Y stage and the fine movement stage 11 on the reticle 12. Furthermore, the driving control of the fine movement stage 11 is also achieved by feedforward control of the difference between the scanning speeds of the Y stage 2 for the wafer 5 and the rough movement stage 10 for the reticle 12. Therefore, the time from the beginning of the scanning to the beginning of synchronous scanning of the reticle 12 and the wafer 5 can be shortened, and the throughput of the exposure process can be improved. In addition, since the moving distances (running distances) required before synchronous scanning are shortened, the strokes, along the Y direction, of the Y stage 2 and the rough movement stage 10 can be shortened, and the entire apparatus can be rendered compact.

Furthermore, when the fine movement stage 11 is driven in accordance with the speed command signal corresponding to the scanning speed difference, as stated before, it is desirable to avoid mechanical resonance of the fine movement stage 11. Thus, in the present embodiment, the notch filter circuit 58 is provided in the feedforward loop to eliminate the mechanical resonance frequency components, whereby the mechanical resonance of the fine movement stage 11 can be suppressed. Further, since the notch filter circuit 58 is arranged in the feedforward loop, not in the feedback loop, the operation does not become unstable.

Note that the operations of the respective elements in the main control system 22A in FIG. 7 may be executed in a software manner. Components from the speed control system 52 to the position control system 55 in FIG. 8 may be constituted by conventional PID controllers (proportional, integral, and differential controllers), or controllers which are subjected to phase advance/delay compensation. The gain constants (e.g., the position gain constant $K_P$) of the control systems are determined by the mechanical constants of the respective stages.

The fine movement stage 11 may be omitted as described in connection with the first embodiment. A fine movement stage, which is movable at least along the Y direction relative to the Y stage 2, may then be arranged on the Y stage 2, and the wafer 5 may be placed on this fine movement stage. Further, the rough movement stage 10 or the Y stage 2 may be arranged on the fine movement stage, and the rough movement stage 10 and the reticle 12 or the Y stage 2 and the wafer 5 may be integrally arranged to be finely movable in the scanning direction (the Y direction in the present embodiment) by this fine movement stage. Also, fine movement stages may be arranged for both of the reticle 12 and the wafer 5.

The third embodiment of the present invention will be described below with reference to FIG. 10. The arrangement of a projection exposure apparatus of the step-and-scan method employed in this embodiment is substantially the same as that shown in FIGS. 1, 2A, 2B and 7. However, in the present embodiment, the driving control of the fine movement stage 11 in the scanning direction (the Y direction) is not performed during the scanning exposure. More specifically, the synchronous scanning of the reticle 12 and the wafer 5 is performed only by the speed control of the rough movement stage 10 and the Y stage 2. In other words, the fine movement stage 11 having three directions (the X direction, the Y direction and the rotating direction) of free movement is not necessary in this embodiment. Only a stage mechanism which can finely regulate the position of the reticle 12 in the non-scanning direction (the X direction) and the rotating direction may be arranged.

Figure 10:
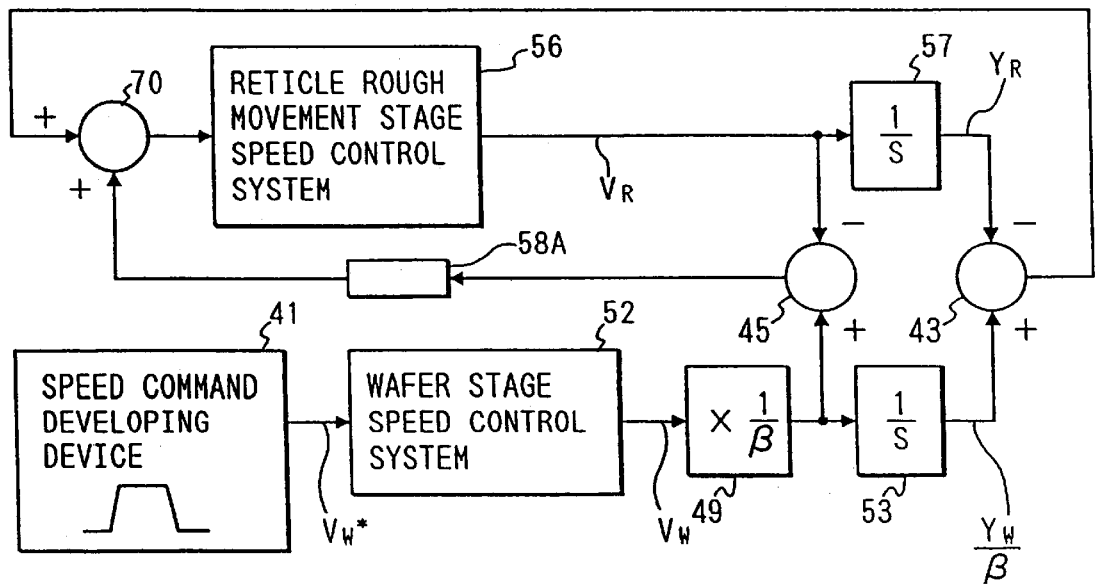
FIG. 10 is a functional block diagram showing a control system of stages according to the third embodiment of the present invention.

FIG. 10 shows a functional block diagram of a control system for scanning operation in the present embodiment. Components in FIG. 10 corresponding to those in FIGS. 7 and 8 are given the same reference numerals, and detailed description thereof will be omitted. Referring to FIG. 10, a speed command signal representing the target scanning speed $V_W^*$ of the wafer stage output from the speed command developing device 41 is supplied to the wafer stage speed control system 52, whereby the Y stage 2 (the wafer 5) is accelerated. Then, the scanning speed $V_W$, in the Y direction, of the Y stage 2 measured by this speed control system 52 is supplied to the multiplier 49. A speed command signal corresponding to the scanning speed ($V_W/\beta$) output from the multiplier 49 is supplied to the subtracter 45 and the integrator 53. A signal corresponding to the scanning speed ($V_R$), in the −Y direction, of the rough movement stage 10 measured by the speed control system 56 is also supplied to the substrater 45. A speed command signal corresponding to the difference $\{(V_W/\beta)-V_R\}$ between the scanning speeds output from the subtracter 45 is supplied to the adder 70 via a notch filter circuit 58A. The notch frequency of the notch filter circuit 58A in the present embodiment is the same as the mechanical resonance frequency of the rough movement stage 10.

A signal corresponding to the position ($Y_W/\beta$) converted to the reference frame of the reticle, in the Y direction, of the Y stage 2 output from the integrator 53 is supplied to the subtracter 43. The scanning speed $V_R$, in the −Y direction, of the rough movement stage 10 output from the speed control system 56 is integrated by the integrator 57, and a signal corresponding to the position $Y_R$ thus obtained is also supplied to the subtracter 43. A speed command signal corresponding to the difference $\{(Y_W/\beta)-Y_R\}$ between the positions output from the subtracter 43 is supplied to the adder 70. The adder 70 adds the speed command signal from the substracter 43 and the speed command signal from the notch filter circuit 58A together, and supplies the -speed command signal thus calculated to the rough movement stage speed control system 56.

Thus, in this embodiment, the rough movement stage 10 is accelerated such that both the positional difference $\{(Y_W/\beta)-Y_R\}$ and the scanning speed difference $\{(V_W/\beta)-V_R\}$ between the rough movement stage 10 and the Y stage 2 on the side of the reticle become zero. The difference $\{(V_W/\beta)-V_R\}$ between the scanning speeds of the Y stage 2 and the rough movement stage 10 is fed forward to the speed control system 56. For this reason, the scanning speed of the rough movement stage 10 follows the scanning speed of the Y stage 2 on the side of the reticle in a short time so that the time up to the synchronous scanning can be shortened, as compared to that in the conventional example (FIG. 6). Since the mechanical resonance of the rough movement stage 10 is prevented from occurring by the notch filter circuit 58A, the synchronous scanning is performed stably. However, since the rough movement stage 10 is large-sized and the mechanical resonance thereof does not readily occur in the present embodiment (FIG. 10), the notch filter circuit 58A can be omitted.

In the control system shown in FIG. 10, the speed command signal corresponding to the difference $\{(V_W/\beta)-V_R\}$ between the scanning speeds is fed forward to the speed control system 56. However, this speed command signal may be fed back to the speed control system 52, as shown in FIG. 11.

Figure 11:
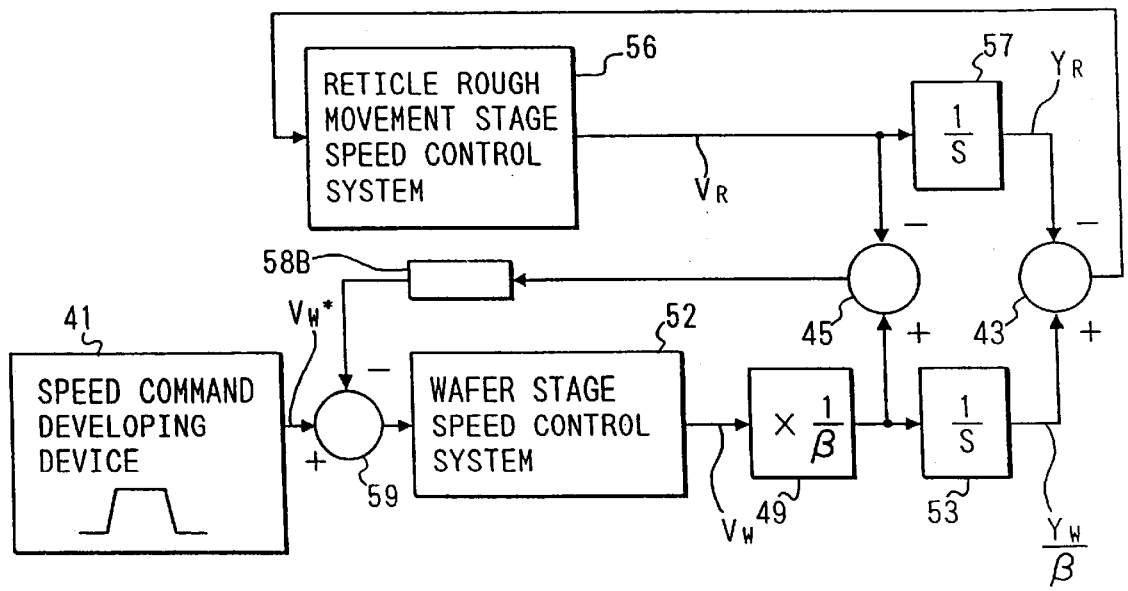
FIG. 11 is a functional block diagram showing a modification of the third embodiment (FIG. 10).

FIG. 11 is a functional block diagram showing a modification of the control system of the third embodiment (FIG. 10). Referring to FIG. 11, a speed command signal representing the target scanning speed $V_W^*$ of the wafer stage output from the speed command developing device 41 is supplied to the subtracter 59, and a speed command signal corresponding to the difference $\{(V_W/\beta)-V_R\}$ between the scanning speeds output from the subtracter 45 is supplied to the subtracter 59 via a notch filter circuit 58B. The notch frequency of the notch filter circuit 58B is the same as the mechanical resonance frequency of the Y stage 2. However, since the Y stage 2 is large-sized and the mechanical resonance thereof does not readily occur, the notch filter circuit 58B can be omitted also in the control system in FIG. 11.

Furthermore, the subtracter 59 subtracts the speed command signal representing the difference $\{(V_W/\beta)-V_R\}$ between the scanning speeds from the speed command signal representing the target scanning speed along $V_W^*$, and supplies the speed command signal thus calculated to the speed control system 52. Therefore, the speed control system 56 is driven by the speed command signal corresponding to the difference $\{(Y_W/\beta)-Y_R\}$ between the positions of the rough movement stage 10 and the Y stage 2. In the control system shown in FIG. 11, the time required for the acceleration of the rough movement stage 10 is the same as that in the conventional example, but the time required for the Y stage 2 to reach the target scanning speed $V_W^*$ can be shortened. For this reason, the time up to the beginning of the synchronous scanning of the rough stage 10 and the Y stage 2 can be shortened.

The present invention is not limited to the above embodiments, and various changes and modifications may be made without departing from the spirit and scope of the invention.

What is claimed is:

1. An exposure apparatus which exposes a pattern of a mask on a substrate utilizing an exposure beam, comprising:
    a mask driving stage which drives said mask;
    a substrate driving stage which drives said substrate;
    an optical device which is disposed in a path of said exposure beam and exposes said pattern on said substrate, said path being defined between said mask and said substrate;
    a first stage measuring device which measures a position of one of said mask driving stage and said substrate driving stage while said one stage is driving;
    a fine movement stage which is provided in a vicinity of said one stage and moves relative to said one stage;
    a fine movement stage measuring device which measures a position of said fine movement stage while said fine movement stage is moving; and
    a controller connected to said first stage measuring device, said fine movement stage, and said fine movement stage measuring device, said controller controlling said fine movement stage in accordance with measuring results obtained by said first stage measuring device and said fine movement stage measuring device.

2. An exposure apparatus according to claim 1, wherein said first stage measuring device measures a position of said mask driving stage.

3. An exposure apparatus according to claim 2, wherein said fine movement stage is provided on said mask driving stage.

4. An exposure apparatus according to claim 2, wherein said fine movement stage holds said mask.

5. An exposure apparatus according to claim 1, wherein said fine movement stage is provided with a reflection element, and said fine movement stage measuring device includes a beam emitting device which emits a beam toward said reflection element.

6. An exposure apparatus according to claim 5, wherein said reflection element is a corner cube type reflection element.

7. An exposure apparatus according to claim 1, wherein said fine movement stage measuring device is a double-pass type interferometer.

8. An exposure apparatus according to claim 1, further comprising:
    a second stage measuring device which measures a position of the other of said mask driving stage and said substrate driving stage.

9. An exposure apparatus according to claim 1, wherein said fine movement stage is moveable two-dimensionally in a plane, and said fine movement stage measuring device measures a two-dimensional position of said fine movement stage.

10. An exposure apparatus according to claim 1, wherein said exposure apparatus is a scanning type exposure apparatus which provides synchronized movement of said mask with said substrate to expose said pattern of said mask on said substrate.

11. An exposure apparatus according to claim 10, wherein a plurality of said fine movement stage measuring device are used to measure a position of said fine movement stage along a direction of said synchronized movement.

12. An exposure apparatus according to claim 11, wherein said direction is a scanning direction, and said controller controls said fine movement stage during a scanning exposure.

13. A scanning type exposure apparatus utilizing an exposure beam, comprising:
    a mask driving stage which drives a mask;
    a substrate driving stage which drives a substrate;
    an optical device which is disposed in a path of said exposure beam and exposes said pattern on said substrate, said path being defined between said mask and said substrate;
    a first stage measuring device which measures a position of one of said mask driving stage and said substrate driving stage during a scanning exposure;
    a fine movement stage which is provided in a vicinity of said one stage and moves relative to said one stage;
    a fine movement stage measuring device which measures a position of said fine movement stage during said scanning exposure; and
    a control device connected to said first stage measuring device, said fine movement stage, and said fine movement stage measuring device, said control device controlling said fine movement stage during said scanning exposure.

14. A scanning type exposure apparatus according to claim 13, wherein said control device moves said fine movement stage along a scanning direction.

15. A scanning type exposure apparatus according to claim 13, wherein said control device sets a speed of said fine movement stage based on a difference between a speed of said mask driving stage and a speed of said substrate driving stage.

16. A scanning type exposure apparatus according to claim 13, wherein said first stage measuring device measures a position of said mask driving stage.

17. A scanning type exposure apparatus according to claim 16, wherein said control device sets a speed of said fine movement stage based on a difference between a position of said fine movement stage and a position of said substrate driving stage.

18. A scanning type exposure apparatus according to claim 13, further comprising:
    a filter member which eliminates a mechanical resonance frequency component of said fine movement stage.

19. A scanning type exposure apparatus according to claim 18, wherein said filter member is a notch filter.

20. A scanning type exposure apparatus according to claim 18, wherein said filter member is a band elimination filter.

21. A scanning type exposure apparatus according to claim 13, wherein said control device controls said fine movement stage in accordance with measuring results obtained by said first stage measuring device and said fine movement stage measuring device.

22. An exposure method of exposing a pattern of a mask on a substrate, comprising:

providing a fine movement stage in a vicinity of one of a mask driving stage which drives said mask and a substrate driving stage which drives said substrate, said fine movement stage moving relative to said one stage;

measuring a position of said one stage while said one stage is driving and a position of said fine movement stage while said fine movement stage is moving; and controlling said fine movement stage in accordance with the position of said one stage measured by said measuring and the position of said fine movement stage measured by said measuring.

23. An exposure method according to claim 22, wherein said one stage is said mask driving stage.

24. An exposure method according to claim 23, wherein said fine movement stage is provided on said mask driving stage.

25. An exposure method according to claim 22, wherein said fine movement stage is provided with a reflection element, and wherein said measuring a position of said fine movement stage includes emitting a beam toward said reflection element.

26. An exposure method according to claim 22, further comprising:

measuring a position of the other of said mask driving stage and said substrate driving stage.

27. An exposure method according to claim 22, further comprising:

providing synchronized movement of said mask with said substrate to expose said pattern of said mask on said substrate.

28. A method of forming a pattern of a mask on a substrate, said method comprising exposing said pattern on said substrate by an exposure method as recited in claim 22.

29. A scanning exposure method, comprising:

providing a fine movement stage in a vicinity of one of a mask driving stage which drives a mask and a substrate driving stage which drives a substrate, said fine movement stage moving relative to said one stage;

measuring a position of said one stage during a scanning exposure and a position of said fine movement stage during said scanning exposure; and controlling said fine movement stage during said scanning exposure.

30. A scanning exposure method according to claim 29, wherein said controlling said fine movement stage includes moving said fine movement stage in a scanning direction during said scanning exposure.

31. A scanning exposure method according to claim 29, wherein said controlling said fine movement stage includes setting a speed of said fine movement stage based on a difference between a speed of said mask driving stage and a speed of said substrate driving stage.

32. A scanning exposure method according to claim 29, wherein said one stage is said mask driving stage.

33. A scanning exposure method according to claim 29, wherein said controlling said fine movement stage includes a control operation in accordance with the measured position of said one stage and the measured position of said fine movement stage.

34. A method of forming a pattern of a mask on a substrate, said method comprising exposing said pattern on said substrate by a scanning exposure method as recited in claim 29.

35. An exposure apparatus which exposes a pattern of a mask on a substrate, comprising:

mask driving means for driving said mask;

substrate driving means for driving said substrate;

first measuring means for measuring a position of one of said mask driving means and said substrate driving means while said one means is driving;

fine movement means which is provided in a vicinity of said one means, said fine movement means moving relative to said one means;

fine movement measuring means for measuring a position of said fine movement means while said fine movement means is moving; and controlling means for controlling said fine movement means in accordance with measuring results obtained by said first measuring means and said fine movement measuring means.

36. A scanning type exposure apparatus, comprising:

mask driving means for driving a mask;

substrate driving means for driving a substrate;

first measuring means for measuring a position of one of said mask driving means and said substrate driving means during a scanning exposure;

fine movement means provided in a vicinity of said one driving means, said fine movement means moving relative to said one driving means;

fine movement measuring means for measuring a position of said fine movement means during said scanning exposure; and controlling means for controlling said fine movement means during said scanning exposure.

37. An exposure apparatus for exposing an image of a pattern formed on a mask onto a substrate, comprising:

a first mask stage which holds said mask so as to position the mask with a first degree of precision;

a second mask stage which is supported in such a way that the second mask stage is movable relative to said first mask stage, so as to position said mask with a second degree of precision;

a first measurement device which detects information on a position of said first mask stage, at least a part of said first measurement device being provided on said first mask stage; and a second measurement device which detects information on a position of said second mask stage, at least a part of said second measurement device being provided on said second mask stage.

38. An exposure apparatus according to claim 37, wherein said first mask stage is a fine movement stage and said second mask stage is a coarse movement stage.

39. An exposure apparatus according to claim 37, wherein said first measurement device includes a first interferometer and said first mask stage has a reflection surface which reflects a measurement beam emitted from said first interferometer.

40. An exposure apparatus according to claim 37, wherein said second measurement device includes a second interferometer and said second mask stage has a reflection surface for reflecting a measurement beam emitted from said second interferometer.

41. An exposure apparatus according to claim 37, wherein at least one of said first mask stage and said second mask stage is driven by a linear motor.

42. An exposure apparatus according to claim 37, further comprising a substrate stage which holds said substrate so as to position the substrate.

43. An exposure apparatus according to claim 42, further comprising a control device connected to said first mask stage, said second mask stage and said substrate stage, said control device controlling, upon exposure, at least one of said first mask stage, said second mask stage and said substrate stage such that said mask and said substrate are moved synchronously with respect to a predetermined direction.

44. An exposure apparatus according to claim 43, wherein said first measurement device detects information on a position of said first mask stage with respect to at least said predetermined direction and said second measurement device detects information on a position of said second mask stage with respect to at least said predetermined direction.

45. A substrate on which an image of said pattern formed on said mask has been exposed by an apparatus as recited in claim 37.

46. An exposure apparatus for exposing an image of a pattern formed on a mask onto a substrate, comprising:
- a mask stage which holds said mask so as to position the mask;
- a substrate stage which holds said substrate so as to position the substrate;
- a fine movement stage which is provided on one of the mask stage and the substrate stage in a manner that allows relative movement between said fine movement stage and said one of the mask stage and the substrate stage to effect fine positioning of said mask or said substrate;
- a first measurement device which detects information on a position of said fine movement stage, at least a part of said first measurement device being provided on said fine movement stage; and
- a second measurement device which detects information on a position of said one of the mask stage and the substrate stage on which said fine movement stage is provided, at least a part of said second measurement device being provided on said one of the mask stage and the substrate stage on which said fine movement stage is provided.

47. An exposure apparatus according to claim 46, wherein said first measurement device includes a first interferometer and said fine movement stage has a reflection surface which reflects a measurement beam emitted from said first interferometer.

48. An exposure apparatus according to claim 46, wherein said second measurement device includes a second interferometer and said one of the mask stage and the substrate stage on which said fine movement stage is provided has a reflection surface which reflects a measurement beam emitted from said second interferometer.

49. An exposure apparatus according to claim 46, further comprising a control device connected to said mask stage, said substrate stage and said fine movement stage, said control device controlling, upon exposure, at least one of said mask stage, said substrate stage and said fine movement stage such that said mask and said substrate are moved synchronously with respect to a predetermined direction.

50. An exposure apparatus according to claim 49, wherein said first measurement device detects information on a position of said fine movement stage with respect to at least said predetermined direction and said second measurement device detects information on a position of said one of the mask stage and the substrate stage on which said fine movement stage is provided with respect to at least said predetermined direction.

51. A substrate on which an image of said pattern on said mask has been exposed by an apparatus as recited in claim 46.

* * * * *